(12) United States Patent
Sekiguchi

(10) Patent No.: US 6,747,587 B2
(45) Date of Patent: Jun. 8, 2004

(54) DIGITAL / ANALOG CONVERTER

(75) Inventor: Masaru Sekiguchi, Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 10/403,037

(22) Filed: Apr. 1, 2003

(65) Prior Publication Data

US 2004/0090356 A1 May 13, 2004

(30) Foreign Application Priority Data

Nov. 11, 2002 (JP) ................................. P2002-327079

(51) Int. Cl.[7] ............................................... H03M 1/80
(52) U.S. Cl. ..................... 341/153; 341/144; 341/159; 341/137
(58) Field of Search ................................ 341/144, 153, 341/159, 158, 161, 137

(56) References Cited

U.S. PATENT DOCUMENTS

| | | | | |
|---|---|---|---|---|
| 4,990,915 A | * | 2/1991 | Kondoh et al. | ............. 341/144 |
| 5,111,205 A | * | 5/1992 | Morlon | ........................ 341/156 |
| 5,257,034 A | * | 10/1993 | Turner et al. | ................ 343/915 |
| 5,539,405 A | * | 7/1996 | Norsworthy | ................ 341/153 |
| 5,808,573 A | * | 9/1998 | Shih et al. | ................... 341/110 |
| 6,281,825 B1 | * | 8/2001 | Lee | ............................. 341/144 |
| 6,310,568 B1 | * | 10/2001 | Kurooka | ...................... 341/144 |
| 6,313,776 B1 | * | 11/2001 | Brown | ........................ 341/144 |
| 6,362,759 B1 | * | 3/2002 | Biernacki et al. | ............ 341/137 |
| 6,384,763 B1 | * | 5/2002 | Leung et al. | ................ 341/153 |
| 6,549,154 B2 | * | 4/2003 | Isobe et al. | .................. 341/153 |

FOREIGN PATENT DOCUMENTS

| | | |
|---|---|---|
| JP | 61-196622 | 8/1986 |
| JP | 04-262622 | 9/1992 |

* cited by examiner

*Primary Examiner*—Jean JeanGlaude
*Assistant Examiner*—Lam Mai
(74) *Attorney, Agent, or Firm*—Volentine Francos, PLLC

(57) ABSTRACT

A D/A converter is provided which is capable of avoiding an increase in occupied areas of the D/A converter on a board and of obtaining an output characteristic being excellent in linearity, which enables achievement of the D/A converter having a small integral-linearity error (INL) and a small differential-linearity error (DNL). The reference current composite blocks are cascaded between current controlling device groups and an output switch. At least one out of reference current composite blocks divides composite reference current amounts based on a predetermined weight and outputs them.

6 Claims, 5 Drawing Sheets

T1~T4:CURRENT CONTROLLING BLOCK
t11~t44:TRANSISTOR(CURRENT CONTROLLING ELEMENT)
C1~C4:REFERENCE CURRENT COMPOSITE BLOCK
c11~c44:TRANSISTOR

DIGITAL / ANALOG CONVERTER

BACKGROUND OF THE INVENTION

1. Field of the Invention

The present invention relates to a digital/analog converter being capable of outputting an analog amount of currents corresponding to a digital amount of an input signal.

2. Description of the Related Art

A digital/analog converter (hereinafter referred simply to as a "D/A converter") has many transistors adapted to output an amount of reference currents precisely set in advance. However, depending on a place where each transistor is located on a board, a minute departure from a reference current amount occurs in an amount of currents output from each transistor. This phenomenon is attributable to changes in conditions of biases to be fed to each transistor due to a voltage drop caused by a minute resistance possessed by a ground line itself, variations in processing conditions imposed during manufacturing, or a like. As a result, a difference occurs in an amount of output currents among transistors. This difference depends on relative positional relations among transistors. For example, if transistors are placed in proximity to one another, they are placed under similar conditions and therefore such the difference in an amount of output currents does not occur easily among the transistors. However, if transistors are placed apart from one another, such the difference readily occurs among the transistors. In order to achieve a D/A converter having an output characteristic being excellent in linearity by avoiding occurrence of such the phenomenon, various technological developments are proceeding (for example, refer to Patent Reference No. 1).

Outlines of the above Patent Reference No.1 are described by referring to attached drawings. FIG. 4 is a circuit diagram showing configurations of a conventional D/A converter. FIG. 5 is a graph showing an amount of changes in a current output caused by a difference in mounting locations of transistors.

As shown in FIG. 4, the conventional D/A converter includes an output terminal 101 to output an amount of currents corresponding to a digital amount of an input current, a switch controlling section 102 to exert switching control according to a predetermined number of bits (here in the example, 2 bits), a current converting section 103 to produce an amount of currents corresponding to a digital amount of an input current, an output switch 104 to be ON-OFF controlled by the switch controlling section 102, and a bias terminal 130 to which a bias voltage to be fed to each transistor is applied.

The current converting section 103 has four current controlling blocks P1 to P4 each being made up of four MOS (Metal Oxide Semiconductor) transistors. Now let it be assumed that a predetermined output current amount being a reference current amount for each of the MOS transistors T11 to T44 is $I_0$. Mounting locations of the current controlling blocks P1 to P4 in the graph shown in FIG. 5 correspond to a mounting location (left to right facing the drawing) of each block on a board. Also, let it be assumed that, as shown in FIG. 5, a difference between an output current amount and a reference current amount $I_0$ for each of transistors in the current controlling block P1 is $-2\Delta I_0$, a difference between an output current amount and a reference current amount $I_0$ for each of transistors in the current controlling block P2 is $-\Delta I_0$, a difference between an output current amount and a reference current amount $I_0$ for each of transistors in the current controlling block P3 is $\Delta I_0$, a difference between an output current amount and a reference current amount $I_0$ for each of transistors in the current controlling block P4 is $2\Delta I_0$.

In this case, a current amount $I_{s1}$, flowing through a switch SW1 is a composite sum of a current amount flowing through the transistor T14 being $I_0-2\Delta I_0$, a current amount flowing through the transistor T21 being $I_0-\Delta I_0$, a current amount flowing through the transistor T34 being $I_0+\Delta I_0$ and a current amount flowing through the transistor T41 being $I_0+2\Delta I_0$, that is, $I_{s1}=4I_0$.

Similarly, a current amount $I_{S2}$ flowing through a switch SW2 is a composite sum of a current amount flowing through the transistor T13 being $I_0-2\Delta I_0$, a current amount flowing through the transistor T22 being $I_0-\Delta I_0$, and a current amount flowing through the transistor T33 being $I_0+\Delta I_0$, and a current amount flowing through the transistor T42 being $I_0+2\Delta I_0$, that is, $I_{S2}=4I_0$. Likewise, a current amount flowing through a switch SW3 being $I_{S3}=4I_0$ and a current amount flowing through a switch SW4 being $I_{S4}=4I_0$ That is, each of the current amounts $I_{s1}$, $I_{S2}$, $I_{S3}$, and $I_{S4}$ flowing respectively through each of the switch SW1 to SW4, since a variation in an amount of currents relative to the reference current amount $I_0$ is a sum total of current amounts of four transistors to be used for comparison, becomes equal to one another. This enables avoidance of variations in current amounts occurring due to a difference in mounting locations of each transistor among the current controlling blocks P1 to P4 on the board.

As a prior art technological reference related to the present invention, a following reference is available:

Patent Reference No.1: Japanese Patent Application Laid-open No. Hei 4-262622 (Summary)

However, the conventional D/A converter disclosed in the Japanese Patent Application Laid-open No. Hei 4-262622 has problems to be solved. That is, though the conventional D/A converter having 2-bit resolution is disclosed in the above Patent Application, if a D/A converter having, for example, 4-bit resolution has to be achieved based on the technology disclosed in the above Patent Application, it is made necessary for the D/A converter to be configured so that 15 pieces of current controlling blocks each having 15 pieces of transistors are controlled by 15 pieces of switches, which causes extremely increased occupied areas of the D/A converter on a board. To solve this problem, a method may be available in which resolution is enhanced by weighting low-order 2 bits, out of the 4 bits, for controlling, thereby inhibiting the increase in the occupied area of the block. In this case, in addition to block groups, which correspond to high-order 2 bits, configured in a manner similar to the above-mentioned conventional technology, 2 blocks through each of which an amount of currents being ¼ and ½ times an amount of currents flowing the above block groups flows are independently provided on which weighting is exerted for controlling.

In this case, though a difference in current amounts which occurs due to a difference in mounting locations in block groups configured in a manner similar to the above conventional technology can be cancelled by configuring as above, since each of the blocks for weight controlling is independently provided, it is difficult to reduce variations in an amount of currents. Therefore, such the method described above has not yet become commercially practical.

SUMMARY OF THE INVENTION

In view of the above, it is an object of the present invention to provide a D/A converter which is capable of inhibiting an increase in occupied areas of the D/A converter on a board and of obtaining an output characteristic being excellent in linearity.

According to a first aspect of the present invention, there is provided a D/A converter including:

first current controlling device groups, each group being partitioned by a predetermined number of current controlling devices and each outputting a current to define an amount of currents corresponding to a bit value of an input digital signal;

second current controlling device groups, each group being partitioned by a predetermined number of current controlling devices being cascaded a specified current controlling device in the first current controlling device groups and each producing a composite sum of currents output from the specified current controlling device corresponding to cascaded connection;

an output switch outputting a composite current summed by the second current controlling device group based on switch control corresponding to a bit value of an input digital signal; and wherein a current to be fed to the output switch is divided at a specified ratio by at least one of the second current controlling groups.

In the foregoing, a preferable mode is one wherein each of current controlling devices included in the first current controlling device groups and the second current controlling device groups is located in a manner so as to unify bias conditions on each current controlling device included in each of the current controlling device groups.

Also, a preferable mode is one wherein a number of the second current controlling device groups is equal to that of the first current controlling device.

Also, a preferable mode is one wherein each of the first current controlling groups includes a bias controlling device to exert control on a bias voltage to be supplied to each of the current controlling devices in the first current controlling groups using a current having a specified value.

Also, a preferable mode is one wherein each of the bias controlling devices makes up a current mirror circuit together with other current controlling devices contained in each of the first current controlling device groups.

Furthermore, a preferable mode is one wherein each of the current controlling devices contained in the first current controlling device groups and the second current controlling device groups is a MOSFET (Metal-Oxide Semiconductor Field Effect Transistor).

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
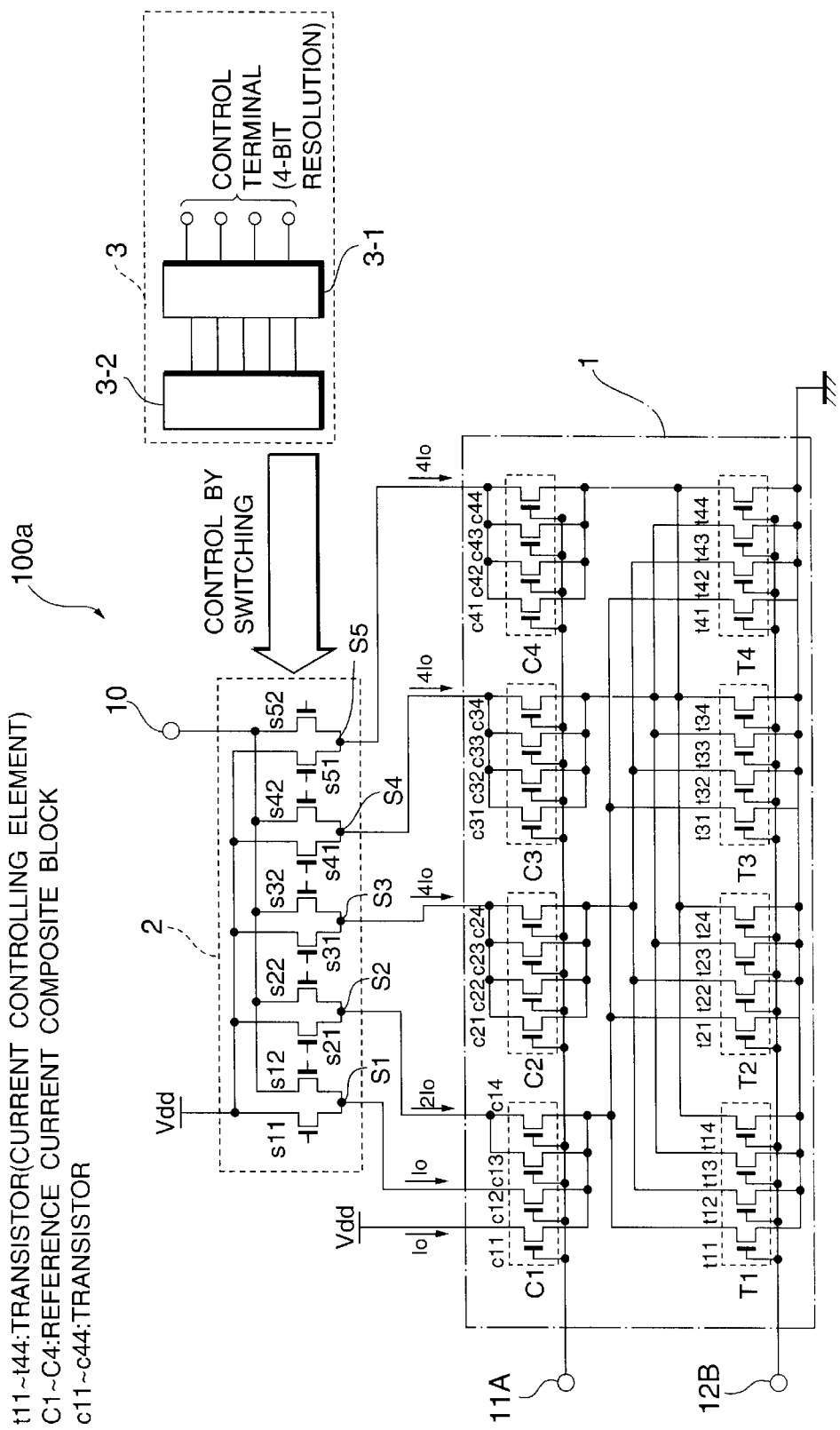
FIG. 1 is a circuit diagram showing configurations of a D/A converter of a first embodiment of the present invention.

In the first embodiment, an example is described in which a D/A converter has 4-bit resolution. FIG. 1 is a circuit diagram showing configurations of the D/A converter 100a of the first embodiment of the present invention. The D/A converter 100a of the embodiment, as shown in FIG. 1, includes a current converting section 1, an output switch 2, and a switch controlling section 3.

The current converting section 1 produces a current corresponding to a bit value of an input digital signal. The current converting section 1 has current controlling blocks T1 to T4 being first current controlling device groups each being put in blocks by a predetermined number of transistors, reference current composite blocks C1 to C4 being second current controlling device groups each being put in blocks by a predetermined number of transistors, and bias terminals 11A and 11B to feed a bias voltage to each transistor in each of the blocks.

The current controlling block T1 is made up of transistors t11, t12, t13, and t14 being arranged in a manner so as to be adjacent to one another on a board. The current controlling block T2 is made up of transistors t21, t22, t23, and t24 being arranged in a manner so as to be adjacent to one another on the board. The current controlling block T3 is made up of transistors t31, t32, t33, and t34 being arranged in a manner so as to be adjacent to one another on the board. The current controlling block T4 is made up of transistors t41, t42, t43, and t44 in a manner so as to be adjacent to one another on the board.

Each of the transistors t11 to t44 is a current controlling device to set a reference current amount $I_0$ for D/A conversion and an n-type transistor is used in the embodiment. Moreover, in the current controlling blocks T1 to T4, changes in bias conditions occur due to a voltage drop caused by a minute resistance possessed by a ground line itself, variations in processing conditions imposed during manufacturing, or a like. As a result, a difference occurs in an amount of output currents among the current controlling blocks.

The reference current composite blocks C1 to C4 are cascaded between the current controlling blocks T1 to T4 and the output switch 2 and produces composite currents flowing through the transistors t11 to t44 of the current controlling blocks based on predetermined rules and outputs the summed composite amounts of currents as composite reference currents. Moreover, a composite reference current output from at least one block out of the reference current composite blocks C1 to C4 is divided based on predetermined weight. In the embodiment, the composite reference current from the reference current composite block C1 is divided at a ratio of 1:1:2.

The reference current composite block C1 is a transistor block made up of transistors c11, c12, c13, and c14 arranged in a manner so as to be adjacent to one another on the board. Also, the reference current composite block C2 is a transistor block made up of transistors c21, c22, c23, and c24 arranged in a manner so as to be adjacent to one another on the board. Also, the reference current composite block C3 is a transistor block made up of transistors c31, c32, c33, and c34 arranged in a manner so as to be adjacent to one another on the board. Furthermore, the reference current composite block C4 is a transistor block made up of transistors c41, c42, c43, and c44 arranged in a manner so as to be adjacent to one another on the board. Moreover, each of transistors making up each of the reference current composite blocks C1 to C4 has the same functions as those of transistors making up each of the current controlling blocks T1 to T4. A number of transistors making up each of the reference current composite blocks C1 to C4 is the same (4 pieces in the embodiment) as that of transistors making up each of the current controlling blocks T1 to T4.

Figure 2:
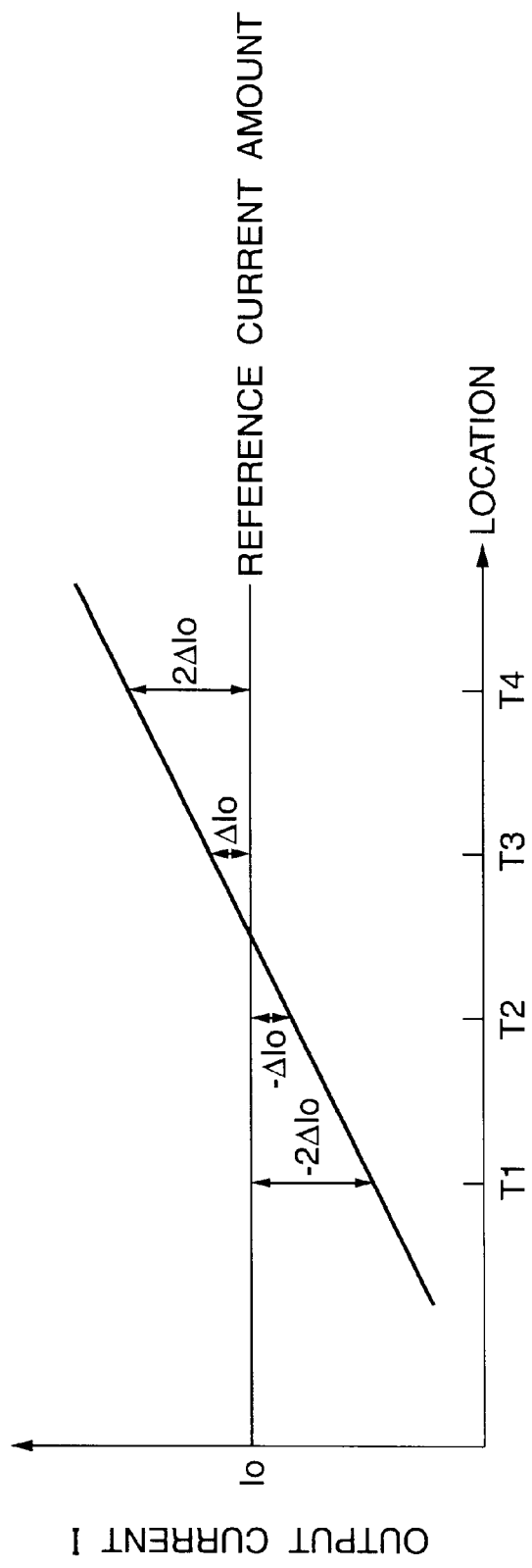
FIG. 2 is a diagram explaining an amount of changes in an output current depending on mounting location s of current controlling blocks on the board according to the first embodiment of the present invention.

An amount of composite reference currents of each of the reference composite blocks C1 to C4 is described. FIG. 2 is a diagram showing an amount of output currents being changed due to a difference in mounting locations of each of current controlling blocks T1, T2, T3, and T4 on the board. Location states of current controlling blocks T1, T2, T3 and T4 arranged left to right facing FIF. 2, that is, sequentially placed along wirings extending from the bias terminal 12B is plotted as abscissa and an amount of currents in each of the current controlling blocks flowing the transistors t11 to t44 as ordinate.

Now let it be assumed that a reference current amount to be used as a reference for the D/A conversion through each transistor is $I_0$. In the embodiment, as shown in FIG. 2, also let it be assumed that an amount of currents flowing through transistors t11 to t14 in the current controlling block T1 is $I_0-2\Delta I_0$, an amount of currents flowing through transistors t21 to t24 in the current controlling block T2 is $I_0-\Delta I_0$, an amount of currents flowing through transistors t31 to t34 in the current controlling block T3 is $I_0+\Delta I_0$, and an amount of currents flowing through transistors t41 to t44 in the current controlling block T4 is $I_0+2\Delta I_0$.

In this case, a current amount $I_{C2}$ flowing through the reference current composite block C2 is a composite sum of a current amount flowing through the transistor t12 being $I_0-2\Delta I_0$, a current amount flowing through the transistor t22 being $I_0-\Delta I_0$, a current amount flowing through the transistor t32 being $I_0+\Delta I_0$ and a current amount flowing through the transistor t42 being $I_0+2\Delta I_0$, that is, $I_{C2}=4I_0$. The current amount $4I_0$ is theoretically equal to an ideal amount of currents $4I_0$ (reference current amount $I_0 \times 4$) obtained from 4 pieces of transistors. Therefore, an increase or a decrease in an amount of currents flowing the block C2 occurring due to a difference in mounting locations of the current controlling block is cancelled.

A current amount $I_{C3}$ flowing through the reference current composite block C3 is a composite sum of a current amount flowing through the transistor t13 being $I_0-2\Delta I_0$, a current amount flowing through the transistor t23 being $I_0-\Delta I_0$, a current amount flowing through the transistor t33 being $I_0+66 I_0$ and a current amount flowing through the transistor t43 being $I_0+2\Delta I_0$, that is, $I_{C3}=4I_0$ and an increase or a decrease in an amount of currents occurring due to a difference in mounting locations is cancelled.

A current amount $I_{C4}$ flowing through the reference current composite block C4 is a composite sum of a current amount flowing through the transistor t14 being $I_0-2\Delta I_0$, a current amount flowing through the transistor t24 being $I_0-\Delta I_0$, a current amount flowing through the transistor t34 being $I_0+\Delta I_0$ and a current amount flowing through the transistor t44 being $I_0+2\Delta I_0$, that is, $I_{C4}=4I_0$ and an increase or a decrease in an amount of currents occurring due to a difference in mounting locations is cancelled.

As described above, each of the current amount $I_{C2}$ flowing through the reference current composite block C2, the current amount $I_{C3}$ flowing through the reference current composite block C3, and the current amount $I_{C4}$ flowing through the reference current composite block C4, since a composite summed amount of currents flowing through one transistor selected from the current controlling blocks T1 to T4 each being placed in a different mounting location is produced, becomes $4I_0$. This enables reduction in variations in an amount of currents among the blocks occurring due to a difference in mounting locations of the current controlling blocks T1 to T4.

The reference current composite blocks C1 to C4, as shown in FIG. 1, are cascaded between the output switch 2 and the current controlling blocks T1 to T4. This enables reduction in variations in an amount of composite reference currents $I_{C1}$ to $I_{C4}$ occurring due to a difference in mounting locations of the reference current composite blocks C1 to C4. As one example to explain the above, cascaded connection between a switch S3 making the output switch 2 and the transistors c21, c22, c23, c24, t12, t32, and t42 is noted.

Let it be assumed that the transistors s11 to s52 making up the output switch 2 are arranged in proximity to one another and therefore no considerations are given to a difference in an amount of currents occurring due to a difference in mounting locations of the transistors s11 to s52. As described above, an increase or a decrease in an amount of currents of the transistors t12, t22, t32, and t42 occurring due to a difference in their mounting locations.

Let it be also assumed that the composite reference current amount $I_{C2}$ ($=4I_0$) of transistors c21, c22, c23, and c24 increases by $\Delta I$ due to a difference in mounting locations of the reference current composite block C2. Due to the above increased amount $\Delta I$, a voltage drop increases in the transistor s31 or s32 in an upper stage and transistors t12, t22, t32, and t42 in a lower stage. Moreover, due to the increase in the voltage drop, a voltage decreases between a source and a drain of each of the transistors c21, c22, c23, and c24 in the reference current composite block C2. As a result, the above increased amount $\Delta I$ in the reference current composite block C2 decreases and the composite reference current amount $I_{C2}$ is feed-back controlled so as to become $4I_0$. That is, even if a change occurs in the composite reference current amount due to a difference in mounting locations of the reference current composite block C2, an effect produced based on the cascaded connection described above can reduce the change to a minimum.

Next, the composite reference current of the reference current composite block C1, which is divided at a ratio of 1:1:2 by weight control and is output, is described. A composite current amount $I_{C1}$ flowing through the entire reference current composite block C1 is a sum of a current amount flowing through the transistor t11 being $I_0-2I_0$, a current amount flowing through the transistor t21 being $I_0-\Delta I_0$, a current amount flowing through the transistor t31 being $I_0+\Delta I_0$ and a current amount flowing through the transistor t41 being $I_0+2\Delta I_0$, that is, $IC1=4I_0$. The current amount $4I_0$ is divided into an amount of currents $I_0$ flowing through the transistor c11, an amount of currents $I_0$ flowing through the transistor c12, and an amount of currents $I_0$ flowing through the transistors c13 and c14.

Now let it be assumed that transistors c11, c12, c13, and c14 making the reference current composite block C1 are arranged in proximity to one another and no considerations are given to variations in an amount of currents. It is thought that variations in an amount of currents between the reference current composite block C1 and other reference current composite blocks C2 to C4 are comparatively small due to the effect induced by the cascaded connection between the reference current composite block C and the current controlling blocks T1 to T4. As a result, the composite reference current amount $I_{c1}$ (=$4I_0$) can be divided precisely at a ratio of 1:1:2 by weighting it using a current amount $I_0$ of the transistor c11, a current amount $I_0$ of the transistor c12, and a current amount $I_0$ of the transistor c14 and can be output then.

The output switch 2 performs conversion and addition on the composite reference current amounts $I_{C1}$, $I_{C2}$, $I_{C3}$, and $I_{C4}$ flowing through the reference current composite blocks C1 to C4 according to input bit values and outputs analog current amounts corresponding to an input bit value. The output switch 2, as shown in FIG. 1, includes the switch S1 having the transistors s11 and s12, the switch S2 having the transistors s21 and s22, the switch S3 having the transistors s31 and s32, the switch S4 having the transistors s41 and s42, and the switch S5 having the transistors s51 and s52. Each of the transistors s11, s21, s31, s41, and s51 is connected to a power source terminal Vdd and each of the transistors s12, s22, s32, s42, and s52 is connected to the output terminal 10. Out of the two transistors making up each of the switches S1 to S5, one of the transistors is in an ON state and another is in an OFF state.

The switch controlling section 3 exerts switching control on the output switch 2 according to a fed digital signal and has internally a decoder 3-1 and a switch controlling circuit 3-2. The decoder 3-1 converts input 4-bit digital information into decimal information and feeds the converted information to the switch controlling circuit 3-2. The switch controlling circuit 3-2 is a control circuit to change the output switch 2 based on an output of the decoder 3-1.

Next, operations of the D/A converter of the embodiment are described.

An example is explained in which 4-bit digital values are input to the switch controlling section 3 in order of 0000→0001→0011→0011→0100→0101→0110→1000→1001→1010→1011→1100→1101→1110→1111. These digital values are fed to the switch controlling circuit 3-2 through the decoder 3-1 and the switch controlling circuit 3-2 changes the output switch 2 in order described below. Moreover, here, ON/OFF of the transistor s12, s22, s32, s42, and s52 being connected to the output terminal 10 is explained. Since the ON/OFF state of each of the transistors s11, s21, s31, s41, and s51 being connected to the power source terminal Vdd becomes reverse to that of the transistors being connected to the output terminal 10, as described above, their descriptions are omitted accordingly.

Following changes occur in the output switch 2 according to control by the switch controlling circuit 3-2. All the transistors s12, s22, s32, s42, and s52 are turned OFF→Transistor s12 is turned ON and transistors s22, s32, s42, and s52 are turned OFF→Transistor s22 is turned ON and transistors s12, s32, s42, and s52 are turned OFF→Transistors s12 and s22 are turned ON and transistors s32, s42, and s52 are turned OFF→Transistor s32 is turned ON and transistors s12, s22, s42, and s52 are turned OFF→Transistors s12 and s32 are turned ON and transistors s22, s42, and s52 are turned OFF→Transistors s22 and s32 are turned ON and transistors s12, s42, and s52 are turned OFF→Transistors s12, s22 and s32 are turned ON and transistors s42 and s52 are turned OFF→Transistors s42 is turned ON and transistors s12, s22, s32, and s52 are turned OFF→Transistor s12, s32, and s42 are turned ON and transistors s22 and s52 are turned OFF→Transistors s22, s32, and s42 are turned ON and transistors s12 and s52 are turned OFF→Transistors s12, s22, s34, and s42 are turned ON and transistor s52 is turned OFF→Transistors s32, s42,and s52 are turned ON and transistor s12, and s22 are turned OFF→Transistors s12, s32, s42 and s52 are turned ON and transistor s22 is turned OFF→Transistors s22, s32, s42, and s52 are turned ON and transistor s12 is turned OFF→All transistors s12, s22, s32, s42, and s52 are turned ON.

Next, a flow of currents in operations of the above switch changing is described. One example is explained in which a case where all the transistors s12, s22, s32, s42, and s52 are ON, that is, in which "1111" being a 4-bit digital maximum value is input.

When all the transistors s12, s22, s32, s42 and s52 are turned ON, if a bias voltage is applied to a bias terminal 11A and a bias terminal 12B, a bias voltage at the bias terminal 12B is converted, by actions of transistors t11 to t44, into a reference current amount $I_0$ and a current I obtained by adding an increased or decreased current amount caused due to a difference in mounting locations of transistors t11 to t44.

Each of the currents flowing through each of the transistors t12, t22, t32, and t42 is summed by the reference current composite block C2. At this point, an increased or decreased amount of currents including $-2\Delta I_0$ to $2\Delta I_0$ is cancelled and the composite reference current amount $I_{C2}$ in the reference current composite block C2 becomes $4I_0$. Likewise, each of currents flowing through each of the transistors t13, t23, t33, and t34 is summed by the reference current composite block C3 and the composite reference current amount $I_{C3}$ becomes $4I_0$ and each of currents flowing through each of the transistors t14, t24, t34, and t44 is summed by the reference current composite block C4 and the composite reference current amount $I_{C4}$ becomes $4I_0$.

Each of currents flowing through each of the transistors t11, t21, t31, and t41 is summed by the reference current composite block C1 and the composite reference current amount $I_{C1}$ becomes $4I_0$. The composite reference current amount $I_{C1}$ (=$4I_0$) is divided into an amount of currents $I_0$ flowing through the transistor c11, an amount of currents $I_0$ flowing through the transistor c13 and an amount of currents $2I_0$ flowing through the transistor c14 in the reference current composite block C1. At this point, as described above, since it is presumed that the transistors c11, c12, c13, and c14 are arranged in proximity to one another, neither increase nor decrease in currents flowing through each of these transistors due to a difference in mounting locations occurs.

A composite sum of an amount of currents $4I_0$ flowing through the reference current composite block C2 passing through the switch S3, an amount of currents $4I_0$ flowing through the reference current composite block C3 passing through the switch S4, an amount of currents $4I_0$ flowing through the reference current composite block C4 passing through the switch S5, an amount of currents $I_0$ flowing through the transistor c12 passing through the switch S1, and an amount of currents $2I_0$ flowing through the transistor c13 and c14 passing through the switch S2 is output as an amount of currents $15I_0$ to the output terminal 10. The amount of currents $15I_0$ corresponds to "1111" being an input digital value. This is a way by which D/A conversion is performed in the D/A converter 100a.

As described above, in the D/A converter 100a of the embodiment, the reference current composite block C1 to weight a composite reference current at a ratio of 1:1:2 and to divide it acts effectively. That is, unlike in the case of conventional technology in which achievement of the D/A converter having 4-bit resolution requires 15 pieces of the current controlling blocks which causes upsizing of the D/A converter, the D/A converter 100a of the embodiment, since being provided with the reference current controlling blocks C1 to C4 being cascaded to the current controlling blocks T1 to T4, can enhance its resolution without causing its increased occupied areas on the board.

Second Embodiment

The D/A converter of the second embodiment aims at obtaining a precisely-controlled amount of output currents by exerting control on an input current by noting relations between an input level of a bias voltage to be fed to a bias terminal of a current controlling block and an amount of currents to be output from an output terminal of the D/A converter. To realize the aim, the D/A converter 100b of the second embodiment is configured as below.

Figure 3:
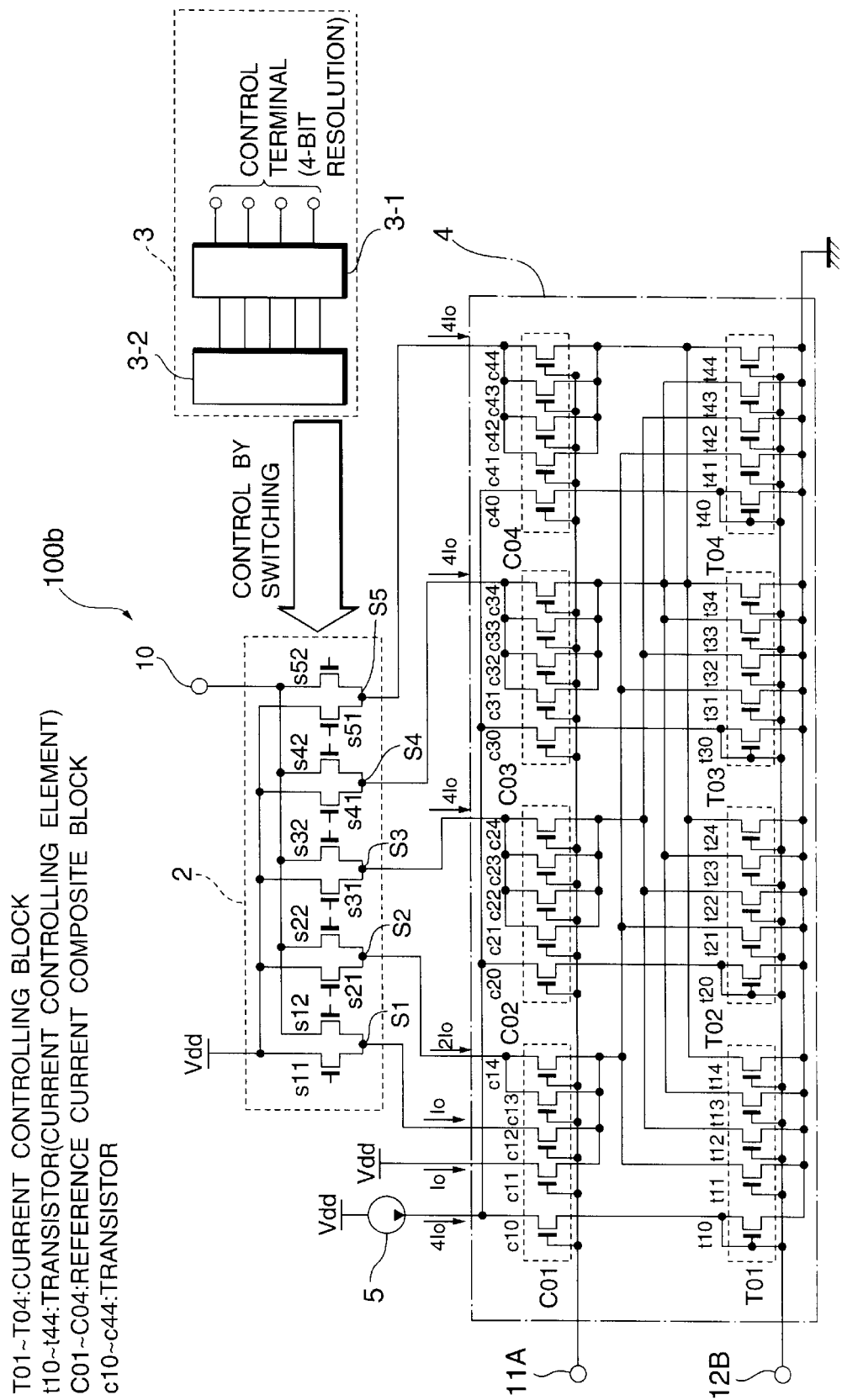
FIG. 3 is a circuit diagram showing configurations of a D/A converter of a second embodiment of the present invention.
Figure 4:
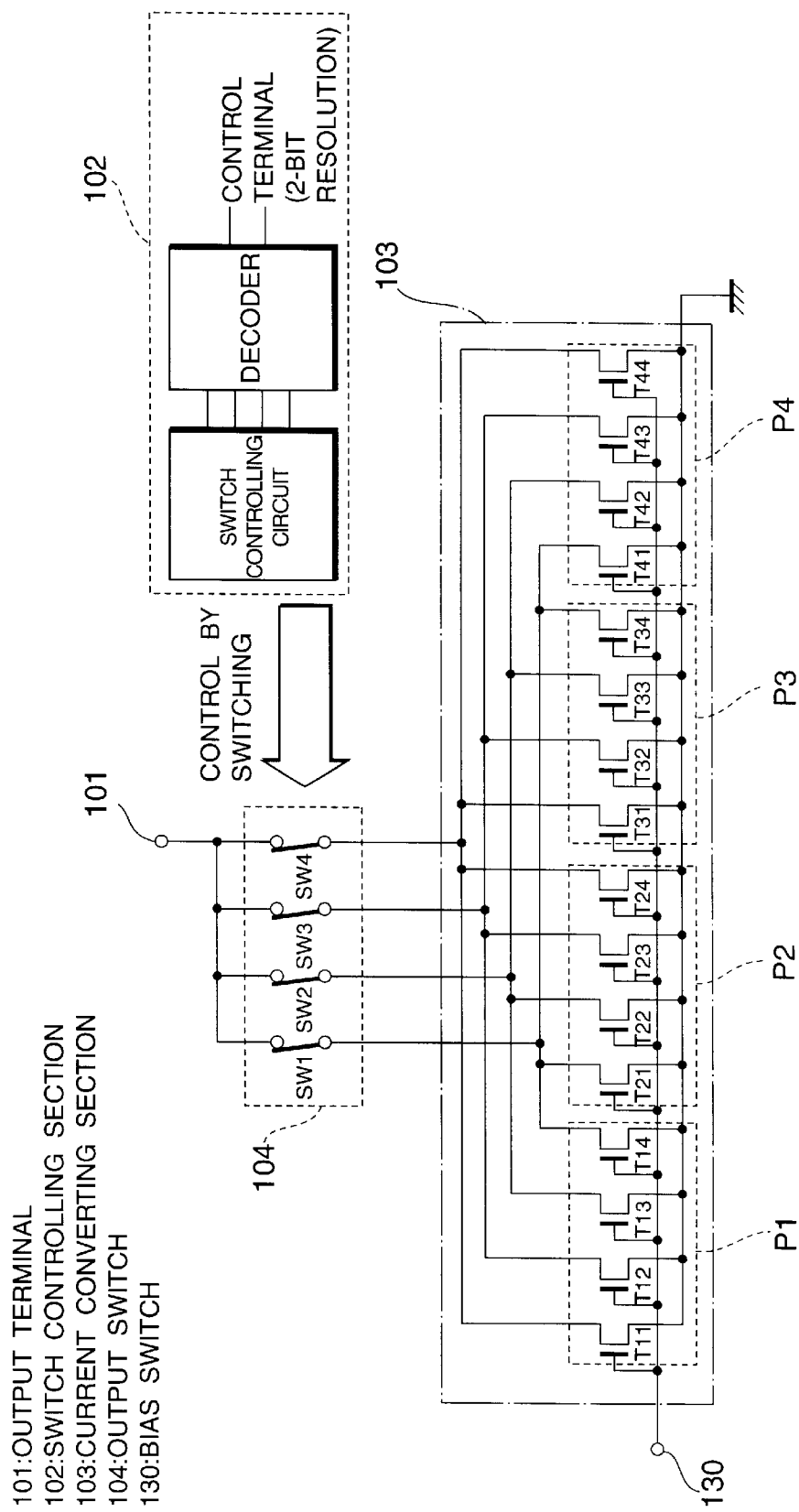
FIG. 4 is a circuit diagram showing configurations of a conventional D/A converter.
Figure 5:
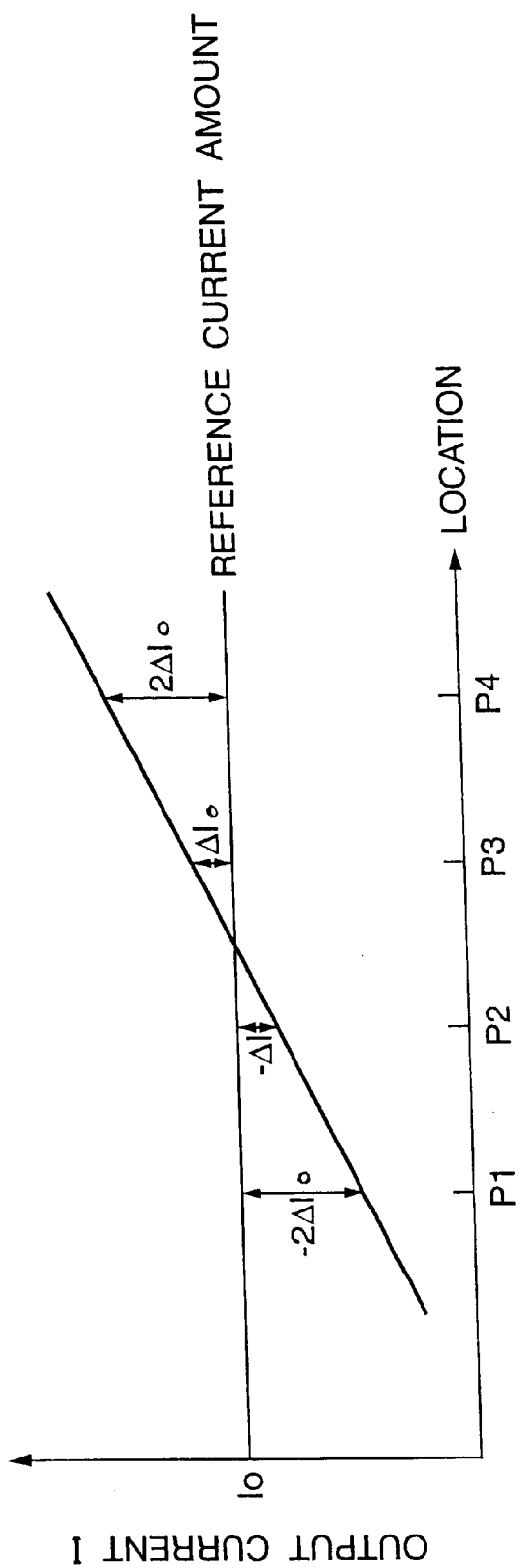
FIG. 5 is a diagram explaining an amount of changes in an output current of the conventional D/A converter.

FIG. 3 is a circuit diagram showing configurations of the D/A converter 00b of the second embodiment of the present invention. As shown in FIG. 3, the D/A 100b includes an output switch 2, a switch controlling section 3, a current converting section 4, and a power source 5.

Hereinafter, components of the D/A 100b of the second embodiment being different from the D/A 100a of the first embodiment are described. The current converting section 4 is a component to produce an amount of an analog current corresponding to a bit value of an input digital signal and, as shown in FIG. 3, includes current controlling blocks T01 to T04 and reference current composite blocks C01 to C04.

The current controlling block T01 is a transistor block configured by putting transistors t10, t11, t12, t13, and t14 being arranged so as to be adjacent to one another on the board together as a block. The current controlling block T02 is a transistor block configured by putting transistors t20, t41, t42, t43, and t44 being arranged so as to be adjacent to one another on the board together as a block. The current controlling block T03 is a transistor block configured by putting transistors t30, t31, t32, t33, and t34 being arranged so as to be adjacent to one another on the board together as a block. The current controlling block T04 is a transistor block configured by putting transistors t40, t41, t42, t43, and t44 being arranged so as to be adjacent to one another on the board together as a block.

The current controlling block of the second embodiment differs from that of the first embodiment in that the current controlling block T01 has, in addition to transistors t11, t12, t13, and t14 adapted to set a reference current amount, a transistor t10 to set a bias voltage. Likewise, the current controlling block T02 of the second embodiment has, in addition to transistors t121, t122, t123, and t124 adapted to set a reference current amount, a transistor t20 to set a bias voltage. The current controlling block T03 of the second embodiment has, in addition to transistors t131, t132, t133, and t134 adapted to set a reference current amount, a transistor t20 to set a bias voltage. The current controlling block T04 of the second embodiment has, in addition to transistors t141, t142, t143, and t144 adapted to set a reference current amount, a transistor t40 to set a bias voltage. These transistors t10, t20, t30, and t40 are transistors having the same functions as those used to set a reference current amount and serve as current mirror circuits to a transistor to set a reference current amount.

The current controlling block C01 is a transistor block configured by putting transistors c10, c11, c12, c13, and c14 being arranged so as to be adjacent to one another on the board together as a block. The current controlling block C02 is a transistor block configured by putting transistors c20, c21, c22, c23, and c24 being arranged so as to be adjacent to one another on the board together as a block. The current controlling block C03 is a transistor block configured by putting transistors c30, c31, c32, c33, and c34 being arranged so as to be adjacent to one another on the board together as a block. The current controlling block C04 is a transistor block configured by putting transistors c40, c41, c42, c43, and c44 being arranged so as to be adjacent to one another on the board together as a block The reference current composite block of the second embodiment differs from that of the first embodiment in that the reference current composite block C01 has, in addition to transistors c11, c12, c13, and c14 adapted to produce a reference current amount by summing a current of each of the transistors c11, c12, c13, and c14, a transistor c10 to set a bias voltage. Likewise, the reference current composite block C02 has, in addition to transistors c21, c22, c23, and c24 adapted to produce a reference current amount by summing a current of each of the transistors c21, c22, c23, and c24, a transistor c20 to set a bias voltage. The reference current composite block C03 has, in addition to transistors c31, c32, c33, and c34 adapted to produce a reference current amount by summing a current of each of the transistors c31, c32, c33, and c34, a transistor c30 to set a bias voltage. The reference current composite block C04 has, in addition to transistors c41, c42, c43, and c44 adapted to produce a reference current amount by summing a current of each of the transistors c41, c42, c43, and c44, a transistor c40 to set a bias voltage. Moreover, the transistors c10, c20, c30, and c40 are transistors having the same function as other transistors. The power source 5 is a power source to produce a bias voltage and its output current amount is set to be $4I_0$.

In the D/A converter 100b, when a bias voltage is applied to the bias terminal 11A, an amount of currents $4I_0$ fed from the power source 5 flows, in a branched manner, through a current path made up of the transistor c10 being cascaded to the transistor t10, through a current path made up of the transistor c20 cascaded to the transistor t20, through a current path made up of the transistor c30 being cascaded to the transistor t30, and through a current path made up of the transistor c40 being cascaded to the transistor t40.

Here, out of the above four current paths, the current path passing through the current controlling block T01 is called a "first current path", the current path passing through the current controlling block T02 is called a "second current path", and the current controlling block T03 is called a "third current path", and the current path passing through the current controlling block T04 is called a "fourth current path". Variations in an amount of currents caused by a difference in mounting locations are reflected in the above four current paths. Now, let it be assumed that an amount of currents flowing through the first current path is $I_0-2\Delta I_0$, an amount of currents flowing through the second current path is $I_0-\Delta I_0$, an amount of currents flowing through the third current path is $I_0+\Delta I_0$, and an amount of currents flowing through the fourth current path is $I_0+2\Delta I_0$.

Based on the above assumption, when a current amount of $I_0-2\Delta I_0$ flows through the transistor t10, an amount of currents flowing through each of the transistors t11, t12, t13, and t14 making up a current mirror circuit together with the transistor t10 is $I_0-2\Delta I_0$. Also, when a current amount of $I_0-\Delta I_0$ flows through the transistor t20, an amount of currents flowing through each of the transistors t21, t22, t23, and t24 making up a current mirror circuit together with the transistor t20 is $I_0-2\Delta I_0$. Likewise, an amount of currents flowing through each of the transistors t31, t32, t33, and t34 is $I_0+2\Delta I_0$ and an amount of currents flowing through each of the transistors t41, t42, t43, and t44 is $I_0+2\Delta I_0$.

As a result, since currents output from each of the current controlling blocks T01 to T04 are added in the same manner as the first embodiment, each of the composite reference current amounts $I_{C2}$ to $I_{C4}$ output from each of the reference current composite blocks C02 to C04 becomes $4I_0$ being equal to a current amount input from the power source 5 and each of the currents $I_0$, $I_0$ and $2I_0$ obtained by dividing the input current $4I_0$ at a ratio of 1:1:2 based on weighting is output. Therefore, by exerting control on a current input to the D/A converter 100b, that is, on an amount of currents fed from the power source 5, a precise output current amount can be obtained without less influences by a difference in mounting locations of transistors.

It is thus apparent that the present invention is not limited to the above embodiments but may be changed and modified without departing from the scope and spirit of the invention. For example, other types of transistors such as p-type MOS transistors or bipolar transistors may be used. Moreover, in the above embodiment, the description is made by employing the D/A converter having 4-bit resolution, however, a D/A converter having higher resolution may be used.

Effects of the Invention

1. Resolution of the D/A converter of the present invention can be enhanced without causing increased occupied areas of the D/A converter on a board.
2. It is possible to obtain an output characteristic being excellent in linearity, which enables achievement of the D/A converter having a small integral-linearity error (INL) and a small differential-linearity error (DNL).
3. It is possible to obtain an output current amount precisely controlled depending on an input current amount by placing transistors making up a current mirror circuit in addition to transistors adapted to set a reference current amount and by controlling these transistors by a current input from an outside.

What is claimed is:

1. A digital/analog converter comprising:

first current controlling device groups, each group being partitioned by a predetermined number of current controlling devices and each outputting a current to define an amount of currents corresponding to a bit value of an input digital signal;

second current controlling device groups, each group being partitioned by a predetermined number of current controlling devices being cascaded a specified current controlling device in said first current controlling device groups and each producing a composite sum of currents output from said specified current controlling device corresponding to cascaded connection;

an output switch outputting a composite current summed by said second current controlling device group based on switch control corresponding to a bit value of an input digital signal; and wherein a current to be fed to said output switch is divided at a specified ratio by at least one of said second current controlling groups.

2. The digital/analog converter according to claim 1, wherein each of current controlling devices included in said first current controlling device groups and said second current controlling device groups is located in a manner so as to unify bias conditions on each current controlling device included in each of said current controlling device groups.

3. The digital/analog converter according to claim 2, wherein a number of said second current controlling device groups is equal to that of said first current controlling device.

4. The digital/analog converter according to claim 1, wherein each of said first current controlling groups includes a bias controlling device to exert control on a bias voltage to be supplied to each of said current controlling devices in said first current controlling groups using a current having a specified value.

5. The digital/analog converter according to claim 4, wherein each of said bias controlling devices makes up a current mirror circuit together with other current controlling devices contained in each of said first current controlling device groups.

6. The digital/analog converter according to claim 1, wherein each of said current controlling devices contained in said first current controlling device groups and said second current controlling device groups is a MOSFET (Metal-Oxide Semiconductor Field Effect Transistor).

* * * * *